(12) United States Patent
Lee et al.

(10) Patent No.: US 12,108,630 B2
(45) Date of Patent: Oct. 1, 2024

(54) DISPLAY DEVICE

(71) Applicant: LG DISPLAY CO., LTD., Seoul (KR)

(72) Inventors: HyunHaeng Lee, Paju-si (KR); Kiwoong Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 515 days.

(21) Appl. No.: 17/538,100

(22) Filed: Nov. 30, 2021

(65) Prior Publication Data

US 2022/0208922 A1 Jun. 30, 2022

(30) Foreign Application Priority Data

Dec. 29, 2020 (KR) ........................ 10-2020-0185418

(51) Int. Cl.
*H10K 59/121* (2023.01)
*G09G 3/3233* (2016.01)

(52) U.S. Cl.
CPC ....... *H10K 59/1216* (2023.02); *G09G 3/3233* (2013.01); *H10K 59/1213* (2023.02); *G09G 2300/0408* (2013.01); *G09G 2300/0426* (2013.01); *G09G 2300/0465* (2013.01); *G09G 2300/0842* (2013.01); *G09G 2310/08* (2013.01)

(58) Field of Classification Search
CPC ........... H10K 59/1216; H10K 59/1213; H10K 59/12; H10K 59/131; G09G 2300/0408; G09G 2300/0426; G09G 2300/0465; G09G 2300/0842; G09G 2320/0295; G09G 2320/043; G09G 3/3233; G09G 2310/08; H01L 27/1222; H01L 27/124; H01L 27/1255
See application file for complete search history.

(56) References Cited

U.S. PATENT DOCUMENTS

| 2014/0291636 | A1* | 10/2014 | Kim  | ..................... | H10K 71/231 |
| | | | | | 438/34 |
| 2019/0393291 | A1* | 12/2019 | Jeon | ..................... | H10K 59/131 |
| 2020/0119122 | A1* | 4/2020 | Jeong | .................. | H10K 59/131 |
| 2021/0305282 | A1* | 9/2021 | Wang | ................. | H01L 27/1255 |

* cited by examiner

*Primary Examiner* — Marcos D. Pizarro
*Assistant Examiner* — Tiberiu Dan Onuta
(74) *Attorney, Agent, or Firm* — Morgan, Lewis & Bockius LLP

(57) ABSTRACT

Embodiments of the present disclosure are related to a display device, as arranging a storage capacitor and an active pattern disposed on a subpixel by using an active layer that a semiconductor layer and a conductive layer are laminated, an area of the storage capacitor can be increased efficiently and methods can be provided to use an area overlapped with a contact-hole located on the active pattern as an area of the storage capacitor. Furthermore, as a location of the contact-hole is adjusted easily, by making the contact-hole not to be disposed on an area adjacent to a driving transistor, a size of the driving transistor can be increased and an aperture ratio of the subpixel can be improved.

20 Claims, 9 Drawing Sheets

DISPLAY DEVICE

CROSS REFERENCE TO RELATED APPLICATION

This application claims priority from Korean Patent Application No. 10-2020-0185418, filed on Dec. 29, 2020, which is hereby incorporated by reference for all purposes as if fully set forth herein.

BACKGROUND

Technical Field

Embodiments of the present disclosure are related to a display device.

Discussion of the Related Art

The growth of the information society leads to increased demand for display devices to display images and use of various types of display devices, such as liquid crystal display devices, organic light emitting display devices, etc.

As an organic light-emitting display device of the display devices displays an image using an organic light-emitting diode emitting a light by itself, thereby it provides advantages that a response speed is fast, a contrast ratio is good, and high color representation is possible.

The organic light-emitting display device can include the organic light-emitting diode disposed in each subpixel, and a driving transistor supplying a driving current to the organic light-emitting diode.

For enhancing a driving performance of the organic light-emitting diode disposed in the subpixel, it is necessary to increase a size of the driving transistor disposed in the subpixel. But there are many difficulties to increase the size of the driving transistor due to various lines and circuit elements disposed in the subpixel.

SUMMARY

Accordingly, embodiments of the present disclosure are directed to a display device that substantially obviates one or more of the problems due to limitations and disadvantages of the related art.

An aspect of the present disclosure is to provide methods being capable of improving an aperture ratio of a subpixel while increasing a size of a driving transistor for driving a light-emitting element disposed in the subpixel.

Another aspect of the present disclosure is to provide methods being capable of increasing a capacity of a storage capacitor while effectively arranging an area that the storage capacitor disposed in the subpixel occupies.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a display panel in which a plurality of subpixels are disposed, and each of the plurality of subpixels including a light-emitting element, a driving transistor electrically connected to the light-emitting element, a storage capacitor electrically connected to the driving transistor, and a first active pattern electrically connected to the storage capacitor.

The storage capacitor can include a first capacitor electrode, a second capacitor electrode located over the first capacitor electrode, and a third capacitor electrode located over the second capacitor electrode and at least a portion of the third capacitor electrode is located on an area overlapped with the first capacitor electrode.

The first active pattern can be disposed on a same layer as a layer where the second capacitor electrode is disposed, and can be electrically connected to the third capacitor electrode through a first contact-hole located in the area overlapped with the first capacitor electrode.

The first active pattern can include a semiconductor layer, and a conductive layer disposed on at least a part area on the semiconductor layer, and at least a portion of the conductive layer can be removed in the first contact-hole.

The third capacitor electrode can contact with a top surface of the semiconductor layer and a side surface of the conductive layer included in the first active pattern in the first contact-hole.

In another aspect, a display device comprises a display panel in which a plurality of subpixels are disposed, and each of the plurality of subpixels including a light-emitting element, a driving transistor electrically connected to the light-emitting element, and a storage capacitor electrically connected to the driving transistor, the storage capacitor including a first capacitor electrode, a second capacitor electrode located over the first capacitor electrode and located on a part area of an area overlapped with the first capacitor electrode, and a third capacitor electrode located over the second capacitor electrode and a portion of the third capacitor is located on an area overlapped with the second capacitor electrode and a rest portion of the third capacitor electrode is located in the area overlapped with the first capacitor electrode among an area other than the area overlapped with the second capacitor electrode.

In another aspect, a display device comprises a substrate, a first capacitor electrode located over the substrate, a second capacitor electrode located over the first capacitor electrode and disposed on a part area of an area overlapped with the first capacitor electrode and electrically connected to the first capacitor electrode, and a third capacitor electrode located over the second capacitor electrode and at least a portion of the third capacitor electrode is disposed in the area overlapped with the first capacitor electrode among an area other than an area overlapped with the second capacitor electrode.

According to various embodiments of the present disclosure, as making a contact-hole not to be disposed on an area adjacent to a driving transistor disposed on a subpixel, a size of the driving transistor can be increased and an aperture ratio of the subpixel can be enhanced.

According to various embodiments of the present disclosure, by using an area overlapped with a contact-hole located on a circuit area of the subpixel as an area of a storage capacitor, a capacity of the storage capacitor can be improved while increasing an area of the storage capacitor effectively.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
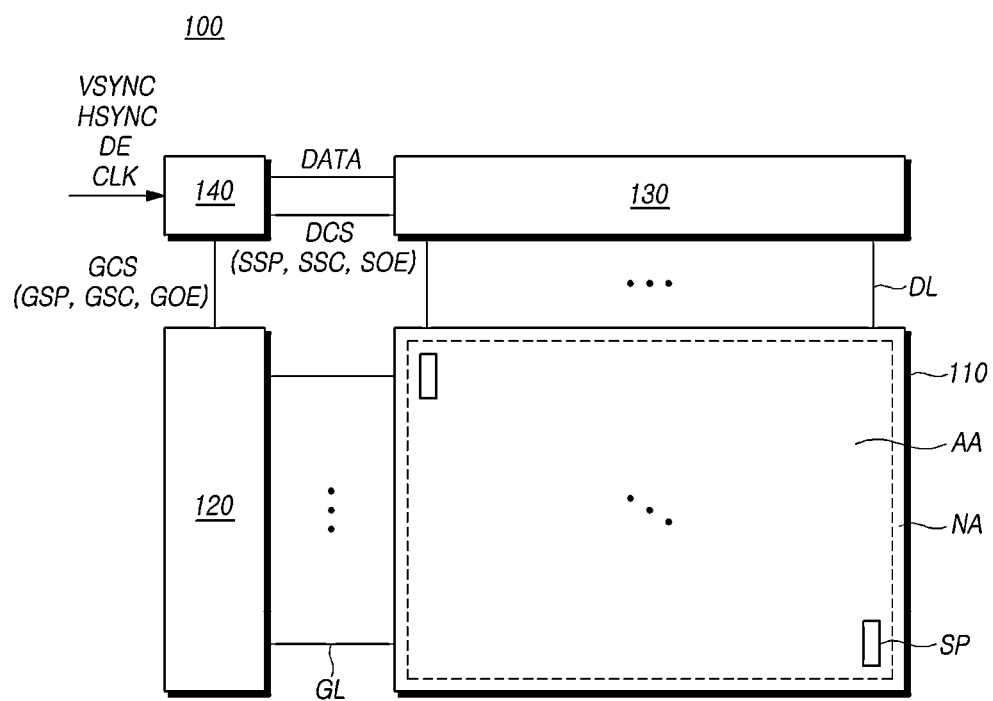
FIG. 1 is a diagram schematically illustrating a configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram schematically illustrating a configuration included in a display device 100 according to embodiments of the present disclosure. All the components of the display device 100 according to all embodiments of the present disclosure are operatively coupled and configured.

Referring to FIG. 1, the display device 100 can include a display panel 110, and a gate driving circuit 120, a data driving circuit 130 and a controller 140 for driving the display panel 110.

The display panel 110 can include an active area AA where a plurality of subpixels SP is disposed, and a non-active area which is located outside the active area AA.

A plurality of gate lines GL and a plurality of data lines DL can be arranged on the display panel 110. The plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can include one or more gate driver integrated circuits GDIC, and can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate driver integrated circuit GDIC can be implemented by a gate-in-panel GIP method to then be directly arranged on the display panel 110. Alternatively, each gate driver integrated circuit GDIC, in some cases, can be integrated and arranged on the display panel 110. Alternatively, each gate driver integrated circuit GDIC can be implemented by a chip-on-film COF method in which an element is mounted on a film connected to the display panel 110.

The data driving circuit 130 receives image data from the controller 140 and converts the image data into an analog data voltage Vdata. The data driving circuit 130 outputs the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit can be directly disposed on the display panel 110. Alternatively, each source driver integrated circuit SDIC, in some cases, can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 120 and the data driving circuit 130, and controls the operation of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 can allow the gate driving circuit 120 to output a scan signal according to the timing implemented in each frame. The controller 140 can convert a data signal received from the outside to conform to the data signal format used in the data driving circuit 130 and then output the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further include a power management integrated circuit for supplying various voltages or currents to the display panel 110, the gate driving circuit 120, the data driving circuit 130, and the like or controlling various voltages or currents to be supplied thereto.

Each of the plurality of subpixels SP can be an area defined by the intersection of the gate line GL and the data line DL, and at least one circuit element including an element emitting a light can be disposed on the subpixel SP.

For example, in the case that the display device 100 is an organic light-emitting display device, an organic light-emitting diode OLED and a plurality of circuit elements can be disposed in each of the plurality of subpixels SP. As the display device 100 drives the plurality of circuit elements to control a current supplying to the organic light-emitting diode OLED disposed on the subpixel SP, and can control that each subpixel SP represents a luminance corresponding to the image data.

Figure 2:
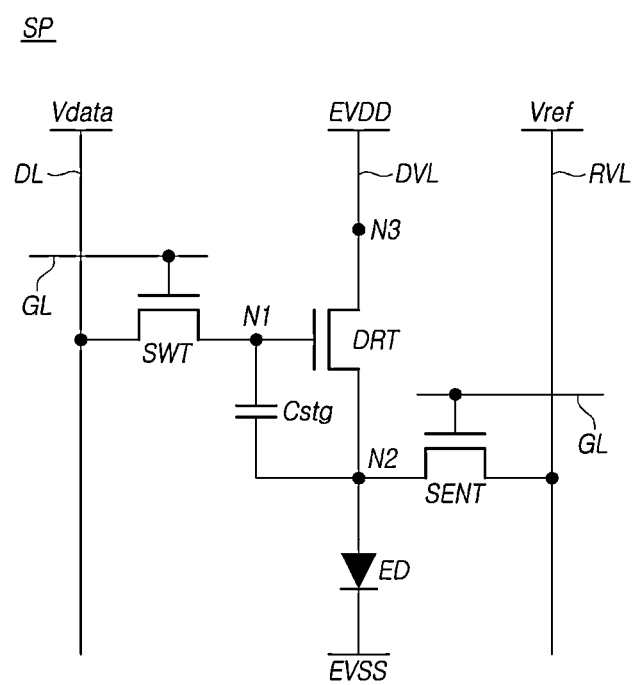
FIG. 2 is a diagram illustrating an example of a circuit structure of a subpixel included in a display device according to embodiments of the present disclosure.

FIG. 2 is a diagram illustrating an example of a circuit structure of the subpixel SP included in the display device 100 according to embodiments of the present disclosure.

FIG. 2 illustrates the example of the circuit structure of the subpixel SP in the case that the display device 100 is the organic light-emitting display device, but embodiments of the present disclosure can be applied to different types of display devices.

Referring to FIG. 2, a light-emitting element ED and a driving transistor DRT for driving the light-emitting element ED can be disposed on the subpixel SP. Furthermore, at least one circuit element other than the light-emitting element ED and the driving transistor DRT can be further disposed on the subpixel SP.

For example, such as the example illustrated in FIG. 2, a switching transistor SWT, a sensing transistor SENT and a storage capacitor Cstg can be further disposed on the subpixel SP.

Thus, the example illustrated in FIG. 2, illustrates a 3T1C structure that three thin film transistors and one capacitor are disposed other than the light-emitting element ED on the subpixel SP as an example, but embodiments of the present disclosure aren't limited to this. Furthermore, the example illustrated in FIG. 2, illustrates a case that all of the thin film transistors are N types as an example, but in some cases, the thin film transistors disposed on the subpixel SP can be P types.

The switching transistor SWT can be electrically connected between the data line DL and a first node N1.

The data voltage Vdata can be supplied to the subpixel SP through the data line DL. The first node N1 can be a gate node of the driving transistor DRT.

The switching transistor SWT can be controlled by the scan signal supplied to the gate line GL. The switching transistor SWT can control that the data voltage Vdata supplied through the data line DL is applied to the gate node of the driving transistor DRT.

The driving transistor DRT can be electrically connected between a driving voltage line DVL and the light-emitting element ED.

A first driving voltage EVDD can be supplied to a third node N3 through the driving voltage line DVL. The first driving voltage EVDD, for example, can be a high potential voltage. The third node N3 can be a drain node or a source node of the driving transistor DRT.

The driving transistor DRT can be controlled by a voltage applied to the first node N1. And the driving transistor DRT can control a driving current supplied to the light-emitting element ED.

The sensing transistor SENT can be electrically connected between a reference voltage line RVL and a second node N2.

A reference voltage Vref can be supplied to the second node N2 through the reference voltage line RVL. The second node N2 can be the source node or the drain node of the driving transistor DRT.

The sensing transistor SENT can be controlled by the scan signal supplied to the gate line GL. The gate line GL controlling the sensing transistor SENT can be same as the gate line GL controlling the switching transistor SWT, or different from that.

The sensing transistor SENT can control that the reference voltage Vref is applied to the second node N2. Furthermore, the sensing transistor SENT, in some cases, can control to sense a voltage of the second node N2 through the reference voltage line RVL.

The storage capacitor Cstg can be electrically connected between the first node N1 and the second node N2. The storage capacitor Cstg can maintain the data voltage Vdata applied to the first node N1 during one frame.

The light-emitting element ED can be electrically connected between the second node N2 and a line supplied with a second driving voltage EVSS. The second driving voltage EVSS, for example, can be a low potential voltage.

When the scan signal of a turned-on level is applied to the gate line GL, the switching transistor SWT and the sensing transistor SENT can be turned-on. The data voltage Vdata can be applied to the first node N1, and the reference voltage Vref can be applied to the second node N2.

The driving current supplied by the driving transistor DRT can be determined according to a difference between a voltage of the first node N1 and a voltage of the second node N2.

The light-emitting element ED can represent a luminance according to the driving current supplied through the driving transistor DRT.

For enhancing a luminance that the subpixel SP represents, it may be very important to increase an area of a light-emitting area that a light emitted from the light-emitting element ED is output to outside in the subpixel SP. In a case of the display device 100 of a bottom light-emitting structure that the light emitted from the light-emitting element ED is output to a bottom surface of a substrate, as the light-emitting area can be disposed on an area other than a circuit area where a circuit element is disposed, it is necessary to arrange the circuit area efficiently for an increase of the light-emitting area.

Figure 3:
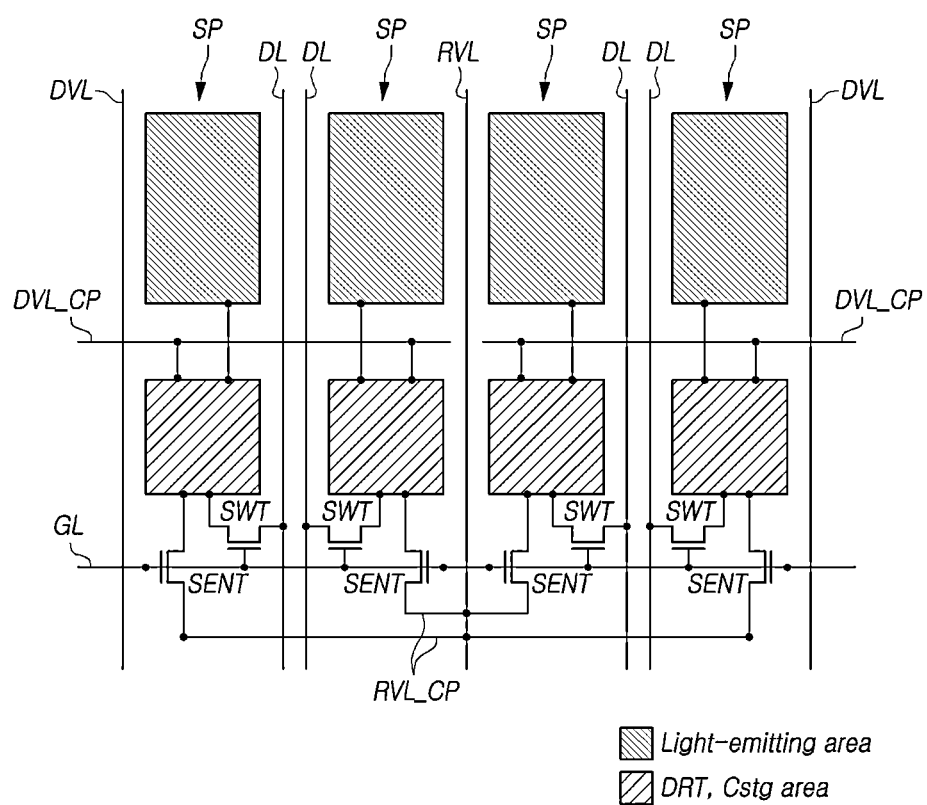
FIG. 3 is a diagram illustrating an example of an arrangement structure of a light-emitting area and a circuit area of a subpixel included in a display device according to embodiments of the present disclosure.

FIG. 3 is a diagram illustrating an example of an arrangement structure of the light-emitting area and the circuit area of the subpixel SP included in the display device 100 according to embodiments of the present disclosure.

Referring to FIG. 3, it illustrates an example of a structure that four subpixels SP located adjacently are disposed. For example, each of four subpixels SP can represent different colors, and four subpixels SP can be constituting one pixel.

The data line DL supplying the data voltage Vdata to each of four subpixels SP can be electrically connected to each of four subpixels SP.

The first driving voltage EVDD supplied through the driving voltage line DVL can be supplied to two or more subpixels SP disposed in a direction crossing the driving voltage line DVL. For example, the first driving voltage EVDD can be supplied to the subpixel SP through a driving voltage line connection pattern DVL_CP electrically connected to the driving voltage line DVL.

The reference voltage Vref supplied through the reference voltage line RVL can be supplied to two or more subpixels SP disposed in a direction crossing the reference voltage line RVL. For example, the reference voltage Vref can be supplied to the subpixel SP through a reference voltage line connection pattern RVL_CP electrically connected to the reference voltage line RVL.

The gate line GL controlling a driving timing of four subpixels SP can be disposed to cross the data line DL. The gate line GL can be electrically connected to the switching transistor SWT and the sensing transistor SENT disposed on each of four subpixels SP.

The circuit area that the circuit element such as the thin film transistor is disposed can be located on an area other than the light-emitting area that the light emitted from the light-emitting element ED is output to outside on four subpixels SP.

The switching transistor SWT and the sensing transistor SENT can be disposed on the circuit area located on the subpixel SP. Furthermore, the driving transistor DRT and the storage capacitor Cstg can be disposed on the circuit area of the subpixel SP.

A light-emitting efficiency that the subpixel SP represents can be enhanced according to a performance of the driving transistor DRT and the storage capacitor Cstg disposed on the circuit area of the subpixel SP.

The display device 100 according to embodiments of the present disclosure provides methods being capable of improving an aperture ratio of the subpixel SP by a structure that the driving transistor DRT and the storage capacitor Cstg are disposed on the circuit area of the subpixel SP efficiently and enhancing the light-emitting efficiency of the light-emitting element ED disposed on the subpixel SP.

Figure 4:
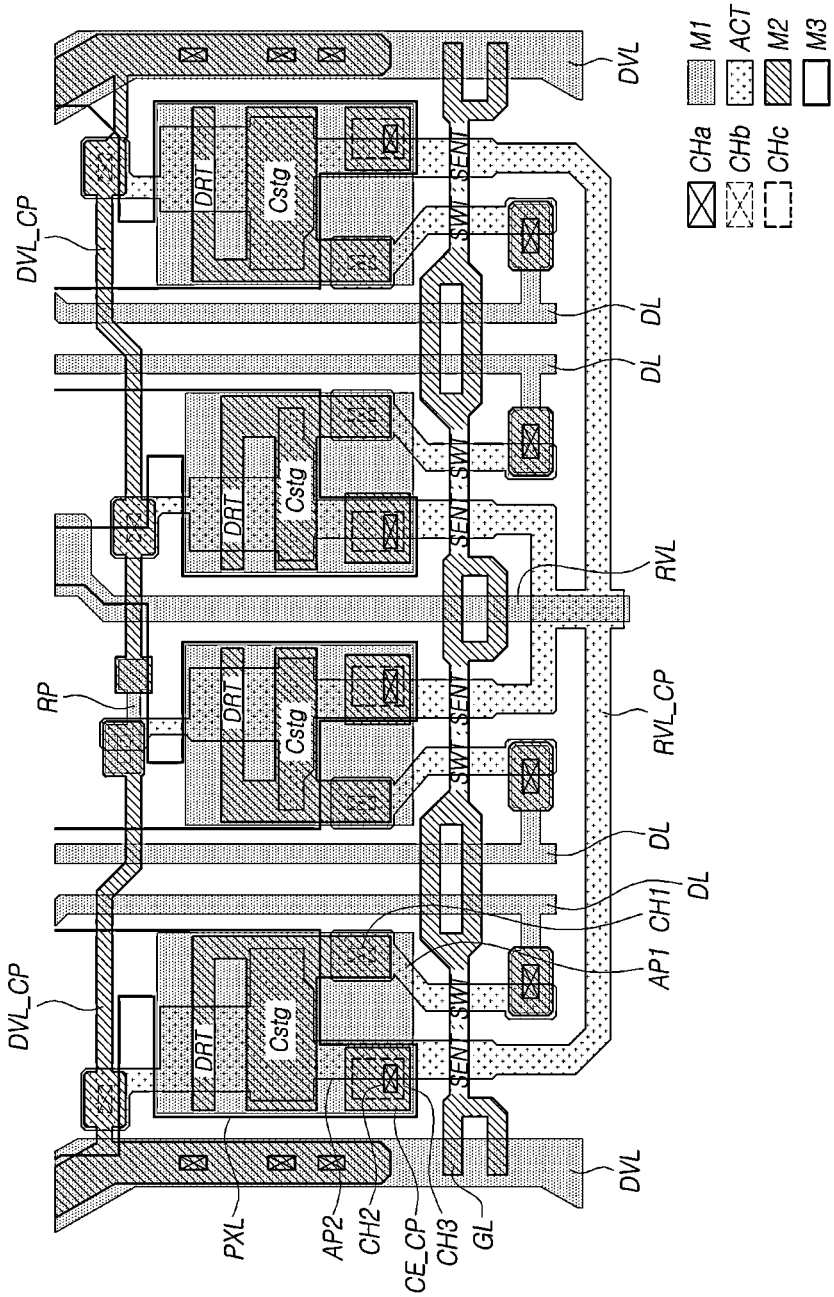
FIG. 4 is a diagram illustrating an example of a specific plane structure of a circuit area of a subpixel included in a display device according to embodiments of the present disclosure.

FIG. 4 is a diagram illustrating an example of a specific plane structure of the circuit area of the subpixel SP included in the display device 100 according to embodiments of the present disclosure.

Referring to FIG. 4, the circuit element and the line disposed on the subpixel SP can be disposed by using two or more metal layer. For example, the circuit element and the line disposed on the subpixel SP can be disposed by using a first metal layer M1, an active layer ACT, a second metal layer M2 and a third metal layer M3.

The first metal layer M1, for example, can be a metal layer located most adjacently to a substrate among metal layers disposed on the substrate. Alternatively, the first metal layer M1 can be a metal layer located more adjacently to the substrate than the active layer ACT, the second metal layer M2 and the third metal layer M3.

For example, the driving voltage line DVL, the data line DL and the reference voltage line RVL can be disposed by using the first metal layer M1. Furthermore, the storage capacitor Cstg can be disposed by using the first metal layer M1.

Furthermore, in some cases, a repair pattern RP can be disposed by using the first metal layer M1.

The repair pattern RP, for example, can be used in a repair process of the gate line GL using the driving voltage line connection pattern DVL_CP when a disconnection defect of the gate line GL occurs.

When the disconnection defect of the gate line GL occurs, a pixel including a point that the gate line GL is disconnected can be darkened. And the driving voltage line DVL can be cut, and the driving voltage line DVL and the gate line GL can be welded. By welding the repair pattern RP and the driving voltage line connection pattern DVL_CP, the scan signal supplied to the gate line GL can be transferred through the cut driving voltage line DVL, the driving voltage line connection pattern DVL_CP and the repair pattern RP.

The active layer ACT can be located over the first metal layer M1.

For example, channel regions of the switching transistor SWT, the sensing transistor SENT and the driving transistor DRT can be disposed by using the active layer ACT. Furthermore, a source electrode and a drain electrode of the thin film transistor can be disposed by using the active layer ACT.

Furthermore, a line or an active pattern AP electrically connected to the thin film transistor can be disposed by using the active layer ACT.

For example, the reference voltage line connection pattern RVL_CP electrically connecting between the reference voltage line RVL and the sensing transistor SENT can be disposed by using the active layer ACT.

As the reference voltage line connection pattern RVL_CP is disposed by using the active layer ACT, the reference voltage line connection pattern RVL_CP and the sensing transistor SENT can be directly connected. An contact-hole for an electrical connection between the reference voltage line connection pattern RVL_CP and the sensing transistor SENT may not be required. Thus, the number of the contact-hole disposed on the subpixel SP can be reduced.

For another example, a first active pattern AP1 electrically connecting between the switching transistor SWT and the storage capacitor Cstg can be disposed by using the active layer ACT. In some cases, it can be considered that the first active pattern AP1 includes at least a portion of the active layer ACT constituting the switching transistor SWT.

For another example, a second active pattern AP2 electrically connecting between the sensing transistor SENT and the storage capacitor Cstg can be disposed by using the active layer ACT. In some cases, it can be considered that the second active pattern AP2 includes a portion of the active layer ACT constituting the sensing transistor SENT.

Furthermore, the storage capacitor Cstg can be disposed by using the active layer ACT. Such as described above, by using the active layer ACT, the reference voltage line connection pattern RVL_CP, the first active pattern AP1, the second active pattern AP2 and the storage capacitor Cstg can be disposed. The reference voltage line connection pattern RVL_CP, the second active pattern AP2 and the storage capacitor Cstg can be disposed integrally. The reference voltage line connection pattern RVL_CP, the sensing transistor SENT and the driving transistor DRT can be a structure connected by using the active layer ACT. Thus, while reducing the contact-hole for an electrical connection between a voltage line and the thin film transistor, a circuit structure of the subpixel SP can be constituted.

The active layer ACT, for example, can be made of a semiconductor material. In this case, the line or the like using the active layer ACT can be disposed by a conducting process.

The active layer ACT, for another example, can be a structure that a metal material is laminated on the semiconductor material. And the semiconductor material and the metal material included in the active layer ACT can be directly contacted with each other. In this case, the metal material of the active layer ACT can be removed on the channel region, and can be disposed on a portion constituting the line or the like.

The second metal layer M2 can be located over the active layer ACT.

For example, the gate line GL can be disposed by using the second metal layer M2. Furthermore, the driving voltage line connection pattern DVL_CP can be disposed by using the second metal layer M2.

Furthermore, the gate electrode of the driving transistor DRT can be disposed by using the second metal layer M2. The storage capacitor Cstg can be disposed by using the second metal layer M2.

Furthermore, in some cases, by using the second metal layer M2, an electrode connection pattern CE_CP electrically connecting the first metal layer M1 and the active layer ACT can be disposed.

The third metal layer M3 can be located over the second metal layer M2.

For example, a pixel electrode PXL can be disposed by using the third metal layer M3. The pixel electrode PXL can be an anode electrode of the light-emitting element ED disposed on the subpixel SP.

Various types of contact-holes for electrically connecting metal layers disposed on different layers each other can be disposed on the subpixel SP.

For example, a plurality of contact-holes CHa disposed by penetrating at least one insulating layer located between the first metal layer M1 and the second metal layer M2 can be located on the subpixel SP.

Furthermore, a plurality of contact-holes CHb disposed by penetrating at least one insulating layer located between the active layer ACT and the second metal layer M2 can be located on the subpixel SP.

Furthermore, a plurality of contact-holes CHc disposed by penetrating at least one insulating layer located between the second metal layer M2 and the third metal layer M3 can be located on the subpixel SP.

The display device 100 according to embodiments of the present disclosure can minimize the number of the lines and the contact-holes disposed on the subpixel SP for enhancing the aperture ratio of the subpixel SP.

For example, since the switching transistor SWT and the sensing transistor SENT are driven by one gate line GL, the number of the gate line GL disposed on the subpixel SP can be reduced.

Furthermore, since a first contact-hole CH1 for a connection of the switching transistor SWT and the sensing transistor SENT, and a second contact-hole CH2 for a connection of the sensing transistor SENT and the storage capacitor Cstg are disposed only, the number of contact-hole disposed on the subpixel SP can be reduced.

Furthermore, as a third contact-hole CH3 for an electrical connection with the pixel electrode PXL is located on an area overlapped with the second contact-hole CH2, an entire area that the contact-hole is disposed can be reduced.

Furthermore, the storage capacitor Cstg disposed on the subpixel SP can be disposed by using three or more layers. Thus, an area that the storage capacitor Cstg occupies on the subpixel SP can be disposed efficiently, and a capacity of the storage capacitor Cstg can be increased.

Figure 5:
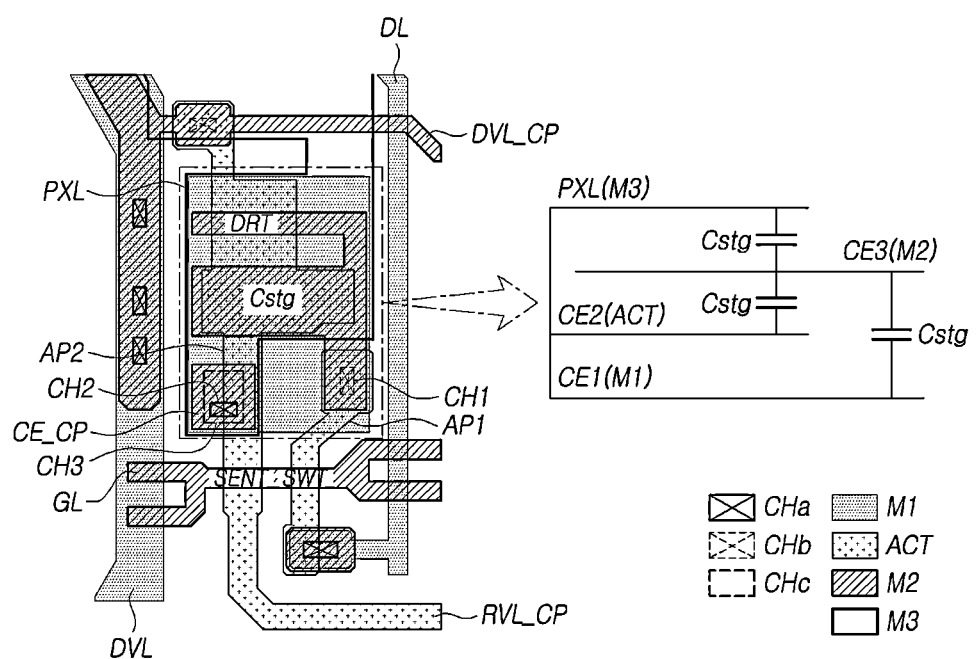
FIG. 5 is a diagram illustrating an example of a structure of a storage capacitor located on a circuit area of a subpixel included in a display device according to embodiments of the present disclosure.

FIG. 5 is a diagram illustrating an example of a structure of the storage capacitor Cstg located on the circuit area of the subpixel SP included in the display device 100 according to embodiments of the present disclosure.

Referring to FIG. 5, the storage capacitor Cstg disposed on the subpixel SP can include a first capacitor electrode CE1, a second capacitor electrode CE2 and a third capacitor electrode CE3.

The first capacitor electrode CE1 can be disposed by using the first metal layer M1.

A portion of the first capacitor electrode CE1 can be overlapped with the driving transistor DRT. A portion of the first capacitor electrode CE1 can be overlapped with the first active pattern AP1.

The second capacitor electrode CE2 can be disposed by using the active layer ACT.

The second capacitor electrode CE2 can be located over the first capacitor electrode CE1. The second capacitor electrode CE2 can be located on a part area of an area overlapped with the first capacitor electrode CE1.

The second capacitor electrode CE2 can be electrically connected to the driving transistor DRT. The second capacitor electrode CE2 can be integral with the active layer ACT constituting the driving transistor DRT.

The second capacitor electrode CE2 can be electrically connected to the second active pattern AP2. The second capacitor electrode CE2 can be integral with the second active pattern AP2.

The second capacitor electrode CE2 can be electrically connected to the first capacitor electrode CE1 by the electrode connection pattern CE_CP. The electrode connection pattern CE_CP can be disposed by using the second metal layer M2.

The third capacitor electrode CE3 can be disposed by using the second metal layer M2.

The third capacitor electrode CE3 can be located over the second capacitor electrode CE2.

The third capacitor electrode CE3 can be located on at least a part area of an area overlapped with the first capacitor electrode CE1. The third capacitor electrode CE3 can be located on at least a part area of an area overlapped with the second capacitor electrode CE2.

A portion of the third capacitor electrode CE3 can overlap the first capacitor electrode CE1 on an area other than an area overlapped with the second capacitor electrode CE2.

The third capacitor electrode CE3 can be electrically connected to the gate electrode of the driving transistor DRT. The third capacitor electrode CE3 can be integral with the gate electrode of the driving transistor DRT.

The third capacitor electrode CE3 can be electrically connected to the first active pattern AP1.

The third capacitor electrode CE3 can be electrically connected to the first active pattern AP1 through the first contact-hole CH1. The first contact-hole CH1 can be located on an area other than an area that the third capacitor electrode CE3 and the gate electrode of the driving transistor DRT are connected.

For example, the third capacitor electrode CE3 can be located between the first contact-hole CH1 and the driving transistor DRT.

As a contact-hole is not located on an area adjacent to the driving transistor DRT, a size of the driving transistor DRT can be increased easily.

And as the third capacitor electrode CE3 is constituting the storage capacitor Cstg with the second capacitor electrode CE2, and is constituting the storage capacitor Cstg with the first capacitor electrode CE1 on an area that is not overlapped with the second capacitor electrode CE2, the capacity of the storage capacitor Cstg can be increased.

Furthermore, the pixel electrode PXL can be electrically connected to the first capacitor electrode CE1 and the second capacitor electrode CE2 through the electrode connection pattern CE_CP.

The pixel electrode PXL can be disposed by using the third metal layer M3, and can be located over the third capacitor electrode CE3.

Thus, the third capacitor electrode CE3 can be constituting the storage capacitor Cstg with the pixel electrode PXL.

As disposing the storage capacitor Cstg by using a plurality of layers, an area that the storage capacitor Cstg is disposed can be constituted efficiently, and the capacity of the storage capacitor Cstg can be increased.

Furthermore, as the first capacitor electrode CE1 is located under the contact-hole CHb, such as the first contact-hole CH1, disposed by penetrating an insulating layer located between the active layer ACT and the second metal layer M2, an area of the storage capacitor Cstg can be maximized.

For example, as disposing the first active pattern AP1 by using the active layer ACT that the semiconductor material and the metal material are laminated, an area overlapped with the first contact-hole CH1 can be used as an area of the storage capacitor Cstg.

And the metal material included in the active layer ACT may not be disposed on the channel region of the thin film transistor disposed on the subpixel SP.

Figure 6:
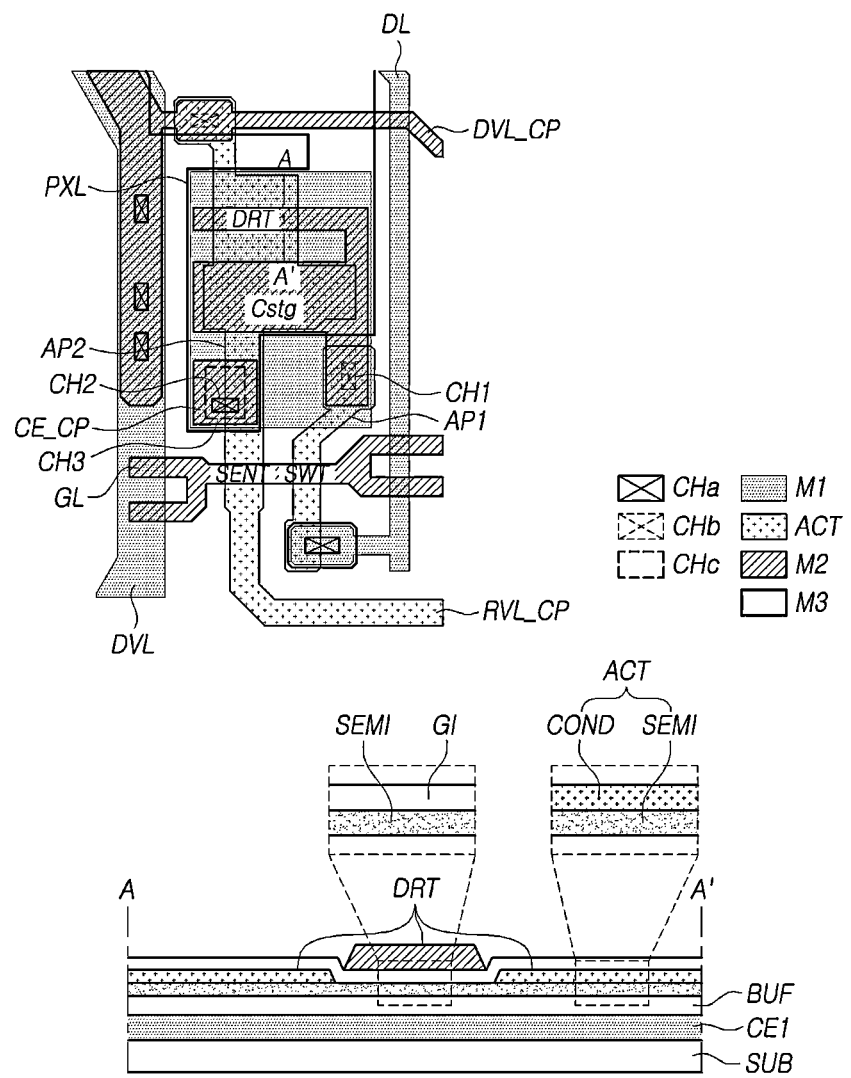
FIG. 6 is a diagram illustrating an example of a cross-sectional structure of a portion A-A' on a circuit area of a subpixel included in a display device according to embodiments of the present disclosure.

FIG. 6 is a diagram illustrating an example of a cross-sectional structure of a portion A-A' on the circuit area of the subpixel SP included in the display device 100 according to embodiments of the present disclosure.

Referring to FIG. 6, it illustrates an example of a cross-sectional structure of the driving transistor DRT disposed on the subpixel SP.

The first capacitor electrode CE1 disposed by using the first metal layer M1 can be disposed on a substrate SUB.

A buffer layer BUF can be disposed on the first capacitor electrode CE1.

The active layer ACT can be disposed on the buffer layer BUF.

The active layer ACT, for example, can include a semiconductor layer SEMI and a conductive layer COND disposed on the semiconductor layer SEMI. The conductive layer COND, for example, can be disposed on at least a part area on the semiconductor layer SEMI of the active layer ACT.

A material constituting the semiconductor layer SEMI included in the active layer ACT, for example, can be oxide semiconductor. The semiconductor layer SEMI can be an oxide of a metal such as a molybdenum Mo, a zinc Zn, an indium In, a gallium Ga, a tin Sn, a titanium Ti, or the like. Alternatively, the semiconductor layer SEMI can be made of a combination of a metal such as the molybdenum Mo, the zinc Zn, the indium In, the gallium Ga, the tin Sn, the titanium Ti, or the like and the oxide thereof. Furthermore, the semiconductor layer SEMI can be a semiconductor material other than the oxide semiconductor, but embodiments of the present disclosure are not limited to these.

The conductive layer COND included in the active layer ACT, for example, can include one of a metal such as an aluminum Al, a gold Au, a silver Ag, a copper Cu, a tungsten W, a molybdenum Mo, a chrome Cr, a tantalum Ta and a titanium Ti or the like or an alloy thereof, but embodiments of the present disclosure are not limited to these.

In a process for disposing the active layer ACT, for example, the conductive layer COND may not be disposed on the channel region of the driving transistor DRT by a half tone exposure process.

The active layer ACT including only the semiconductor layer SEMI can be disposed on the channel region of the driving transistor DRT.

The semiconductor layer SEMI and the conductive layer COND included in the active layer ACT can be disposed as a laminated structure on an area corresponding to a source electrode and a drain electrode of the driving transistor DRT.

A gate insulating layer GI can be disposed on the active layer ACT.

The gate electrode of the driving transistor DRT can be disposed on the gate insulating layer GI.

The gate electrode of the driving transistor DRT can be made of the second metal layer M2, and can be integral with the third capacitor electrode CE3.

A contact-hole may not be located on an area adjacent to the driving transistor DRT.

Thus, the size of the driving transistor DRT can be increased. Furthermore, an area adjacent to the driving transistor DRT can be used as an area of the storage capacitor Cstg.

Figure 7:
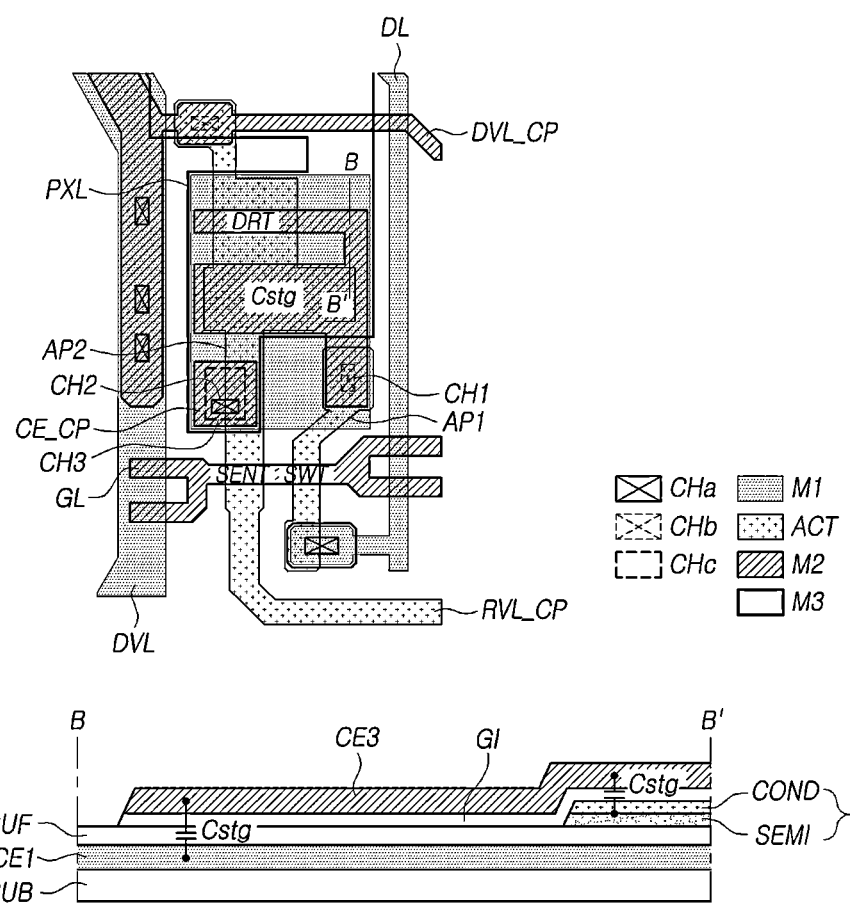
FIG. 7 is a diagram illustrating an example of a cross-sectional structure of a portion B-B' on a circuit area of a subpixel included in a display device according to embodiments of the present disclosure.

FIG. 7 is a diagram illustrating an example of a cross-sectional structure of a portion B-B' on the circuit area of the subpixel SP included in the display device 100 according to embodiments of the present disclosure.

Referring to FIG. 7, the first capacitor electrode CE1 can be located on an area that the third capacitor electrode CE3 and the gate electrode of the driving transistor DRT are connected.

The second capacitor electrode CE2 can be located on a part area on the first capacitor electrode CE1.

The third capacitor electrode CE3 can be located over the second capacitor electrode CE2.

A portion of the third capacitor electrode CE3 can be disposed on an area overlapped with the second capacitor electrode CE2, and can be constituting the storage capacitor Cstg with the second capacitor electrode CE2.

Other portion of the third capacitor electrode CE3 can be located on an area overlapped with the first capacitor electrode CE1 on an area that the second capacitor electrode CE2 is not disposed. Thus, other portion of the third capacitor electrode CE3 can be constituting the storage capacitor Cstg with the first capacitor electrode CE1.

As making it possible to dispose the storage capacitor Cstg on an area that the driving transistor DRT and the third capacitor electrode CE3 are connected while increasing the size of the driving transistor DRT, the capacity of the storage capacitor Cstge can be increased more.

Furthermore, as making an area that the third capacitor electrode CE3 and the first active pattern AP1 are connected to be used as an area of the storage capacitor Cstg, the capacity of the storage capacitor Cstg can be increase efficiently.

Figure 8:
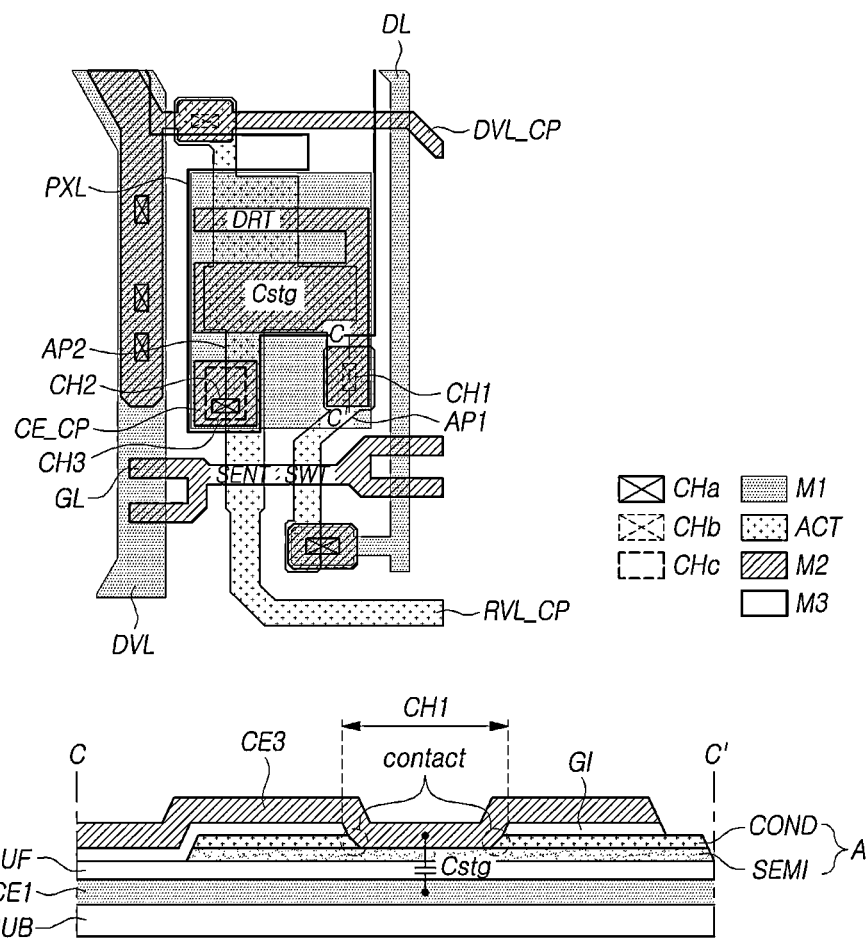
FIG. 8 is a diagram illustrating an example of a cross-sectional structure of a portion C-C' on a circuit area of a subpixel included in a display device according to embodiments of the present disclosure.

FIG. 8 is a diagram illustrating an example of a cross-sectional structure of a portion C-C' on the circuit area of the subpixel SP included in the display device 100 according to embodiments of the present disclosure.

Referring to FIG. 8, the buffer layer BUF can be disposed on the first capacitor electrode CE1. The first active pattern AP1 can be disposed on the buffer layer BUF.

The first active pattern AP1 can include the semiconductor layer SEMI.

The first active pattern AP1 can include the conductive layer COND disposed on a part area on the semiconductor layer SEMI.

The conductive layer COND included in the first active pattern AP1 can be a shape removed on at least a part area of an area corresponding to the first contact-hole CH1. A portion of the conductive layer COND included in the first active pattern AP1 can be removed through a process for disposing the first contact-hole CH1.

For example, the active layer ACT that the semiconductor layer SEMI and the conductive layer COND are laminated can be disposed on the buffer layer BUF. The gate insulating layer GI can be disposed on the active layer ACT.

A process etching the gate insulating layer GI can be performed for disposing the first contact-hole CH1. The process etching the gate insulating layer GI can be a dry etching process, but not limited to this.

In the process etching the gate insulating layer GI, the conductive layer COND disposed on the semiconductor layer SEMI of the active layer ACT can be removed. And in the process etching the gate insulating layer GI, the semiconductor layer SEMI can be remained without being removed.

As the semiconductor layer SEMI of the active layer ACT is remained, it can be prevented that the buffer layer BUF located under the active layer ACT is damaged in the etching process of the gate insulating layer GI.

Thus, since it can be prevented that the third capacitor electrode CE3 disposed on the gate insulating layer GI permeates under the buffer layer BUF, the first capacitor electrode CE1 can be disposed under the first contact-hole CH1.

The conductive layer COND included in the active layer ACT can be remained on an area other than the first contact-hole CH1. And the conductive layer COND can be disposed along an outer edge of the first contact-hole CH1. Furthermore, the conductive layer COND can protrude toward the first contact-hole CH1 under the gate insulating layer GI.

The active layer ACT that a portion of the conductive layer COND disposed on the semiconductor layer SEMI is removed can become the first active pattern AP1.

Through the process described above, the first active pattern AP1 including the semiconductor layer SEMI and the conductive layer COND disposed on a part area on the semiconductor layer SEMI can be disposed.

The second metal layer M2 constituting the third capacitor electrode CE3 can be disposed on the gate insulating layer GI and in the first contact-hole CH1.

The third capacitor electrode CE3, for example, can contact with a top surface of the semiconductor layer SEMI included in the first active pattern AP1 in the first contact-hole CH1. The third capacitor electrode CE3, for example, can contact with a side surface of the conductive layer COND included in the first active pattern AP1 in the first contact-hole CH1. Furthermore, in some cases, the third capacitor electrode CE3 can contact with a top surface of the conductive layer COND included in the first active pattern AP1 in the first contact-hole CH1.

As the third capacitor electrode CE3 contacts with the conductive layer COND of the first active pattern AP1, the third capacitor electrode CE3 and the first active pattern AP1 can be electrically connected.

Thus, the third capacitor electrode CE3 and the switching transistor SWT can be electrically connected. The data voltage Vdata supplied through the data line DL and the switching transistor SWT can be applied to the third capacitor electrode CE3 and the gate electrode of the driving transistor DRT.

The first capacitor electrode CE1 can be located under the first contact-hole CH1.

The third capacitor electrode CE3 can be constituting the storage capacitor Cstg with the first capacitor electrode CE1 on an area that the first contact-hole CH1 is disposed for an electrical connection to the first active pattern AP1.

Embodiments of the present disclosure can improve the capacity of the storage capacitor Cstg while efficiently increasing an area that the storage capacitor Cstg can be disposed on the subpixel SP.

Furthermore, embodiments of the present disclosure can prevent reducing an area of the storage capacitor Cstg due to the contact-hole by minimizing an area that the contact-hole occupies on the subpixel SP.

Figure 9:
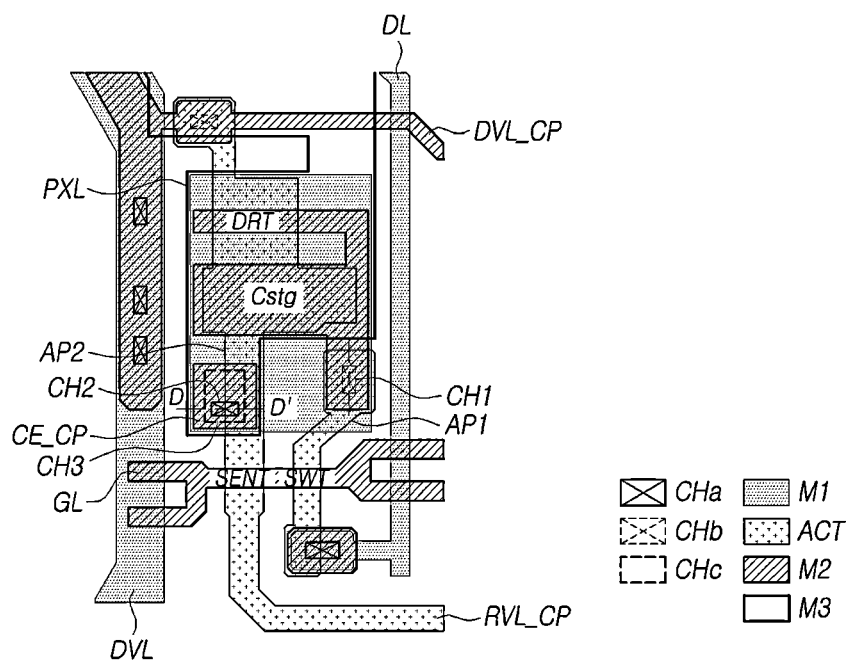
FIG. 9 is a diagram illustrating an example of a cross-sectional structure of a portion D-D' on a circuit area of a subpixel included in a display device according to embodiments of the present disclosure.
Figure 9:
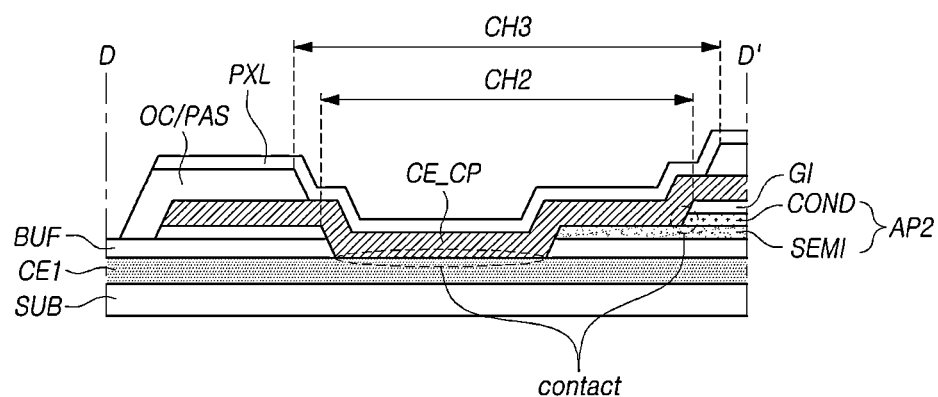

FIG. 9 is a diagram illustrating an example of a cross-sectional structure of a portion D-D' on the circuit area of the subpixel SP included in the display device 100 according to embodiments of the present disclosure.

Referring to FIG. 9, the first capacitor electrode CE1 and the second capacitor electrode CE2 can be electrically connected through the second contact-hole CH2.

The second contact-hole CH2 can be located on an area overlapped with the first capacitor electrode CE1.

The second contact-hole CH2 can be located on a side that the first contact-hole CH1 is located among sides of the storage capacitor Cstg. The second capacitor electrode CE2 constituting the storage capacitor Cstg can be located between the second contact-hole CH2 and the driving transistor DRT.

The second contact-hole CH2 can include the contact-hole CHa which is disposed by penetrating at least one insulating layer located between the first metal layer M1 and the second metal layer M2. Furthermore, the second contact-hole CH2 can include the contact-hole CHb which is disposed by penetrating at least one insulating layer located between the active layer ACT and the second metal layer M2.

For example, the buffer layer BUF can be disposed on the first capacitor electrode CE1.

The active layer ACT can be disposed on a part area on the buffer layer BUF. The active layer ACT can include the semiconductor layer SEMI and the conductive layer COND disposed on the semiconductor layer SEMI.

A portion of the buffer layer BUF and the gate insulating layer GI disposed on the first capacitor electrode CE1 can be removed by the etching process. Furthermore, a portion of the gate insulating layer GI disposed on the active layer ACT can be removed by the etching process.

A portion of the gate insulating layer GI disposed on the active layer ACT is removed, and a portion of the conductive layer COND included in the active layer ACT can be removed.

The active layer ACT that a portion of the conductive layer COND disposed on the semiconductor layer SEMI is removed can become the second active pattern AP2.

A portion of the conductive layer COND included in the second active pattern AP2 can protrude toward outside of the gate insulating layer GI.

The electrode connection pattern CE_CP disposed in the second contact-hole CH2 can contact with a top surface of the first capacitor electrode CE1. Furthermore, the electrode connection pattern CE_CP can contact with a top surface of the semiconductor layer SEMI and a side surface of the conductive layer COND included in the second active pattern AP2.

As the electrode connection pattern CE_CP contacts with the conductive layer COND included in the second active pattern AP2, the second active pattern AP2 and the first capacitor electrode CE1 can be electrically connected. And as the second active pattern AP2 is integral with the second capacitor electrode CE2, the second capacitor electrode CE2 and the first capacitor electrode CE1 can be electrically connected.

Furthermore, the third contact-hole CH3 can be disposed on an area overlapped with at least a portion of the second contact-hole CH2.

The third contact-hole CH3, for example, can be the contact-hole CHc which is disposed by penetrating at least one insulating layer located between the second metal layer M2 and the third metal layer M3. The third contact-hole CH3 can be disposed in a passivation layer PAS and an overcoat layer OC which are disposed on the second metal layer M2.

Through the third contact-hole CH3, the pixel electrode PXL and the electrode connection pattern CE_CP can be electrically connected.

Thus, the pixel electrode PXL can be electrically connected to the storage capacitor Cstg, the sensing transistor SENT and the driving transistor DRT disposed on the subpixel SP through the third contact-hole CH3.

As minimizing the number of the contact-hole disposed on the subpixel SP, reducing an area of the storage capacitor Cstg can be prevented, and the aperture ratio of the subpixel SP can be improved.

According to embodiments of the present disclosure described above, as disposing the storage capacitor Cstg disposed on the subpixel SP by using three or more layers, the capacity of the storage capacitor Cstg can be increased while disposing an area of the storage capacitor Cstg efficiently.

Furthermore, as disposing the active pattern AP disposed on the subpixel SP by using the active layer ACT that the semiconductor layer SEMI and the conductive layer COND are laminated, an area overlapped with the contact-hole disposed on the active pattern AP can be used as an area of the storage capacitor Cstg.

Furthermore, as an area overlapped with the contact-hole can be used as an area of the storage capacitor Cstg, a location of the contact-hole can be easily adjusted, so the contact-hole may not be located on an area adjacent to the driving transistor DRT.

Thus, while increasing the size of the driving transistor DRT and the capacity of the storage capacitor Cstg disposed on the subpixel SP efficiently, the aperture ratio of the subpixel SP can be enhanced.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a display panel in which a plurality of subpixels are disposed, and
wherein each of the plurality of subpixels comprising,
a light-emitting element;
a driving transistor electrically connected to the light-emitting element;
a storage capacitor electrically connected to the driving transistor; and
a first active pattern electrically connected to the storage capacitor,
wherein the storage capacitor comprising,
a first capacitor electrode;
a second capacitor electrode located over the first capacitor electrode; and a third capacitor electrode located over the second capacitor electrode, and at least a portion of the third capacitor electrode is located on an area overlapped with the first capacitor electrode, and wherein the first active pattern is disposed on a same layer as a layer where the second capacitor electrode is disposed, and is electrically connected to the third capacitor electrode through a first contact-hole located in the area overlapped with the first capacitor electrode.

2. A display device, comprising:

a display panel in which a plurality of subpixels are disposed, and wherein each of the plurality of subpixels comprising, a light-emitting element;

a driving transistor electrically connected to the light-emitting element; and a storage capacitor electrically connected to the driving transistor, wherein the storage capacitor comprising, a first capacitor electrode;

a second capacitor electrode located over the first capacitor electrode, and located on a part area of an area overlapped with the first capacitor electrode; and a third capacitor electrode located over the second capacitor electrode, and a portion of the third capacitor is located on an area overlapped with the second capacitor electrode, and a rest portion of the third capacitor electrode is located in the area overlapped with the first capacitor electrode among an area other than the area overlapped with the second capacitor electrode.

3. A display device, comprising:

a substrate;

a first capacitor electrode located over the substrate;

a second capacitor electrode located over the first capacitor electrode, disposed on a part area of an area overlapped with the first capacitor electrode, and electrically connected to the first capacitor electrode; and a third capacitor electrode located over the second capacitor electrode, and at least a portion of the third capacitor electrode is disposed in the area overlapped with the first capacitor electrode among an area other than an area overlapped with the second capacitor electrode.

4. The display device of claim 1, wherein a portion of the third capacitor electrode is located in the area overlapped with the first capacitor electrode among an area other than an area overlapped with the second capacitor electrode.

5. The display device of claim 1, wherein the second capacitor electrode comprises a semiconductor layer, and a conductive layer disposed on an entire area on the semiconductor layer.

6. The display device of claim 1, wherein the first capacitor electrode is electrically connected to the second capacitor electrode.

7. The display device of claim 3, further comprising:

an active pattern disposed on a same layer as a layer where the second capacitor electrode is disposed, and electrically connected to the third capacitor electrode through a contact-hole located in the area overlapped with the first capacitor electrode.

8. The display device of claim 1, wherein the first active pattern comprises a semiconductor layer, and a conductive layer disposed on at least a part area on the semiconductor layer, and wherein at least a portion of the conductive layer is removed in the first contact-hole.

9. The display device of claim 8, wherein the third capacitor electrode contacts with a top surface of the semiconductor layer and a side surface of the conductive layer included in the first active pattern in the first contact-hole.

10. The display device of claim 1, wherein the third capacitor electrode is connected to a gate electrode of the driving transistor.

11. The display device of claim 10, wherein the first contact-hole is located on an area other than an area where the third capacitor electrode and the gate electrode of the driving transistor are connected.

12. The display device of claim 1, wherein the each of the plurality of subpixels further comprising, a second active pattern disposed on a same layer as a layer where the second capacitor electrode is disposed, and connected to the second capacitor electrode; and an electrode connection pattern disposed on a same layer as a layer where the third capacitor electrode is disposed, and electrically connected to the first capacitor electrode and the second active pattern through a second contact-hole located in the area overlapped with the first capacitor electrode.

13. The display device of claim 12, wherein the second active pattern comprises a semiconductor layer, and a conductive layer disposed on at least a part area on the semiconductor layer, and wherein at least a portion of the conductive layer is removed in the second contact-hole.

14. The display device of claim 12, wherein the electrode connection pattern is electrically connected to the light-emitting element through a third contact-hole overlapping at least a portion of the second contact-hole.

15. The display device of claim 12, wherein the second capacitor electrode is located between the second contact-hole and the driving transistor.

16. The display device of claim 13, wherein the electrode connection pattern contacts with a top surface of the semiconductor layer and a side surface of the conductive layer included in the second active pattern in the second contact-hole.

17. The display device of claim 2, wherein the each of the plurality of subpixels further comprising, at least one contact-hole located in the area overlapped with the first capacitor electrode, and located on an area overlapped with the third capacitor electrode.

18. The display device of claim 17, wherein the second capacitor electrode is located between the at least one contact-hole and the driving transistor.

19. The display device of claim 17, wherein the each of the plurality of subpixels further comprising, an active pattern disposed on a same layer as a layer where the second capacitor electrode is disposed, and disposed on an area including an area overlapped with the at least one contact-hole.

20. The display device of claim 19, wherein the active pattern comprises a semiconductor layer disposed entirely in the at least one contact-hole, and a conductive layer disposed along an outer edge of the at least one contact-hole on the semiconductor layer.

* * * * *